(12) United States Patent
Fraedrich

(10) Patent No.: US 7,443,172 B2
(45) Date of Patent: Oct. 28, 2008

(54) METHOD AND APPARATUS FOR THE LOCATION AND INDICATION OF CABLE SPLICES AND CABLE FAULTS

(75) Inventor: Volker Fraedrich, Schmiedeberg (DE)

(73) Assignee: Hagenuk KMT Kabelmesstechnik GmbH (DE)

( * ) Notice: Subject to any disclaimer, the term of this patent is extended or adjusted under 35 U.S.C. 154(b) by 0 days.

(21) Appl. No.: 10/626,843

(22) Filed: Jul. 23, 2003

(65) Prior Publication Data

US 2006/0181284 A1    Aug. 17, 2006

(30) Foreign Application Priority Data

Jul. 30, 2002    (DE) ................. 102 34 537

(51) Int. Cl.
*G01R 31/02* (2006.01)
*G01R 31/28* (2006.01)

(52) U.S. Cl. .................... 324/543; 324/529
(58) Field of Classification Search ............ 324/529
See application file for complete search history.

(56) References Cited

U.S. PATENT DOCUMENTS

| | | | | |
|---|---|---|---|---|
| 4,408,155 A | * | 10/1983 | McBride | 324/539 |
| 5,539,323 A | * | 7/1996 | Davis, Jr. | 324/690 |
| 5,574,376 A | * | 11/1996 | Topp et al. | 324/529 |
| 5,714,885 A | | 2/1998 | Lulham | 324/529 |
| 5,828,219 A | | 10/1998 | Hanlon | 324/529 |
| 7,075,309 B2 | * | 7/2006 | Smith | 324/535 |
| 2003/0010494 A1 | * | 1/2003 | Bose et al. | 166/254.2 |

FOREIGN PATENT DOCUMENTS

DE    19824157    3/2000

\* cited by examiner

*Primary Examiner*—Vincent Q. Nguyen
*Assistant Examiner*—Jeff Natalini
(74) *Attorney, Agent, or Firm*—Finnegan, Henderson, Farabow, Garrett & Dunner, L.L.P.

(57) ABSTRACT

A method and apparatus for the location and indication of cable splices and cable faults is disclosed. An audio frequency generator can be coupled to a cable under test and the magnetic field generated by the cable can be monitored by a receiver. A receiver includes at least two antenna coils situated to detect orthogonal components of the magnetic field. From test values measured at various test points along the cable route, a degree of inhomogeneity of the magnetic field along the cable route can be determined and displayed. Location of a cable fault and cable splice is then apparent in the display.

15 Claims, 3 Drawing Sheets

METHOD AND APPARATUS FOR THE LOCATION AND INDICATION OF CABLE SPLICES AND CABLE FAULTS

RELATED APPLICATIONS

This disclosure claims priority to German filed application DE 102 34 537.6, filed on Jul. 30, 2002, assigned to the same assignee as is the present disclosure, herein incorporated by reference in its entirety.

BACKGROUND

1. Field of the Invention

This invention relates to the location of faults in a buried cable and, more specifically, to a method and apparatus for the location of cable splices and cable faults.

2. Discussion of Related Art

Various methods are utilized in practice to locate cable splices and cable faults. There are proven methods to locate cable splices, for example location with the twist method and the location with the minimum distortion method.

For location according to the twist method, both poles of a generator operating at an audio frequency are connected to two inside conductors at the near end of a cable. This arrangement generates a field along the cable route, the so-called twist field, that, in magnitude, reaches a minimum at a point directly above the cable when both inside conductors lie next to each other horizontally and reaches a maximum directly above the cable when both inside conductors lie vertically above each other.

With a receiver that is tuned to the audio frequency of the generator, the route of the cable can be traced. If the twist of the inside conductors is even, i.e., in regular intervals along the cable run, the change between minimum and maximum fields over the cable can be located. If the twist is interrupted, for example by a cable splice, this regularity of the changing twist field is disturbed.

The disadvantage of the twist method is that location of the pitch (i.e., the distance between successive maxima or minima) of the twist field is only possible if the pitch of layers (i.e., the distance between successive occurrences of the two cables in a particular orientation with respect to one another) of the twisted cable of the inside conductors is approximately the same as the distance of the cable to the receiver. For example, if the twist field results from a medium voltage cable with a pitch of layers of a meter, then the cable can be monitored if it is at a depth (the laying depth) of up to approximately one meter. The twist field of a telecommunication cable whose pitch of layers of the twist is only a couple of centimeters cannot be located at a laying depth of one meter. At such a large disparity between the depth and the pitch of layers, the minima and maxima of the field magnitude at the receiver due to the twist field becomes difficult, if not impossible, to resolve.

In another method of locating faults, the so-called minimum distortion method, one pole of a frequency generator is connected to one end of the cable and the other pole is connected to the earth. The end of the cable is also connected to the earth so that the electric circuit for the audio frequency signal is closed. With a receiver that is tuned to the audio frequency of the frequency generator, the cable route can be tracked according to the traditional minimum method. Above the cable route, a homogeneous magnetic field is generated that creates a very sharp minimum in the receiver when the receiver is located over the cable. In the area of a cable splice or a cable fault, the homogeneity of the magnetic field is distorted in a way that is recognizable. The sharpness of the minimum appears diminished as the receiver is passed over the cable.

The disadvantage in this method is that the evaluation of the minimum distortion is very subjective. The user of such a system is required to have considerable experience in locating such faults with the method and to have some technical qualifications. Most operators of such a system, however, cannot be expected to be so qualified.

An improvement for the location of cable faults with the minimum distortion method has been described in U.S. Pat. No. 5,714,885 (the '885 patent). The '885 patent describes a system where the audio frequency generator couples a combination of two frequencies to the cable under test. The receiver locates, via antenna coils, the magnetic field and, via rods inserted into the ground, the electrical field. Evaluating differential field components from two different driving frequencies can definitely improve location of the cable and location of cable faults and cable splices with the receiver. The system and method described in the '885 patent requires comparatively high effort for the creation of the frequencies in the generator and the evaluation of all signal components in the receiver is relatively elaborate.

Another method for location of cable faults is described in German patent DE-PS 19824157 (the '157 patent). As described in the '157 patent, the generator creates two high frequency signals with audio frequency modulation that are coupled into the cable under test. A receiver evaluates these signals and displays the fault by different sounds. The disadvantage of this method is that by using high frequency signals the range is comparatively small and the system is applicable only for sheathed cables, i.e., coaxial cables. Blind laid cable splices cannot be located with this method.

Yet another method to locate cable faults, especially to locate metallic blank insulation faults in ground cables and pipelines, is described in U.S. Pat. No. 5,828,219 (the '219 patent). As described in the '219 patent, a generator couples a very low frequency signal <10 Hz and an audio frequency signal >100 Hz into the conductor under test (e.g., the cable). The receiver includes a combination of magnetometer and antenna coils. Utilizing the combination of detectors in the receiver, a record of the laying depth and the current intensity along the cable route can be produced. Faults can be located by evaluating the gradient between the available test values for the current intensities.

However, in the method described in the '219 patent, it is necessary to galvanically connect the generator directly to the cable to effectively couple the low frequency component to the cable. The large amount of apparative effort from the receiver required, in consequence of the combination of magnetometer and conventional antenna coils, is disadvantageous. Blind laid cable splices also cannot be located with this method.

All known methods and systems currently utilized have the disadvantage that there are high expectations concerning the apparative effort or the evaluation of the complex signals. Analysis of the signals r can be very subjective and requires the user of the receiver to be very experienced and have high technical qualifications. Therefore, there is a need for a system and method for locating cable splices and cable faults that are both and easy to use.

SUMMARY

In accordance with the present invention, a system and method of locating cable splices and cable faults in a simple way with relatively low apparative effort to clearly indicate the cable splices and cable faults to a user without high qualifications is presented.

Some embodiments of a method of locating cable splices and cable faults according to the present invention include: coupling an audio frequency generator to a cable to provide a magnetic field at an audio frequency; receiving at least two orthogonal components of the magnetic field at a receiver; generating test values corresponding to the orthogonal components of the magnetic field along the cable route; entering the test values at a plurality of test points on the cable route to a test value memory; determining a degree of inhomogeneity along the cable route from the test values in the test value memory; and displaying the degree of inhomogeneity.

In some embodiments, the test values can be obtained at substantially uniform distances along the cable route. Test value measurements can be stored in a memory in response to input from a switch. The degree of inhomogeneity can be displayed in any fashion, for example as line swelling, color identification, or differing patterns on a line trace.

The degree of inhomogeneity can be determined from evaluation of the individual test values of a test value group as well as the continuity of the individual test values within an entire test series. A cable splice or a cable fault can then be clearly identified as position on the cable with a high degree of inhomogoeneity.

The advantages of some embodiments according to the present invention is realized by using an audio frequency generator that is not tied to individual fixed frequencies, or a fixed combination of frequencies, or requires special modulation. A simple implementation of the present invention can be realized by choosing the fundamental frequency of the generator according to the type of the cable to be located with its specific complex electrical parameters, a simple adaptation of the method or the apparition possible. Thus, the parameters of the system can be adjusted for use with large diameter cables having a low fundamental frequency, characteristic of long-haul networks, as well as small diameter cables, characteristic of local networks, where the fundamental frequency is relatively high.

Some embodiments of a system for locating cable splices and cable faults according to the present invention include: an audio frequency generator; and a receiver according to the present invention. Some embodiments of a receiver according to the present invention include a first antenna coil oriented to detect a horizontal component of a magnetic field from a cable coupled to the audio frequency generator, a second antenna coil oriented to detect a vertical component of the magnetic field from the cable coupled to the audio frequency generator, detection circuitry coupled to the first antenna coil and the second antenna coil, and a processor coupled to the detection circuitry, the processor executing software code to determine a degree of inhomogeneity in the magnetic field from test values taken at test points along the cable.

Some embodiments of a receiver according to the present invention can include: a first antenna coil, the first antenna coil providing a first signal in response to a magnetic field; a second antenna coil oriented orthogonally to the first antenna coil, the second antenna coil providing a second signal in response to the magnetic field; a first circuit coupled to receive the first signal from the first antenna coil; a second circuit coupled to receive the second signal from the second antennal coil; a processor coupled to the first circuit and the second circuit, the processor receiving signals related to the first signal and the second signal; a memory coupled with the processor; and a softkey coupled to the processor, wherein the processor executes instructions for taking test values in response to input from the softkey, storing the test values in the memory, and analysing the test values stored in the memory for inhomogeneities in the magnetic field.

Because embodiments of the present invention utilize evaluation of field strength measurements (i.e., the test values) neither modulation nor phase evaluation of the signals needs to be accomplished. The test results, then, are mostly independent of the driving frequency of the audio signal generator coupled to the cable. The analogue circuitry of the receiver, e.g. the first circuit and the second circuit, can be formed with extremely low cost.

A significant advantage of certain embodiments of the present invention is in the immediate display of the test results as a line chart on a monitor or display on the receiver. The formation of a test series of several test results and their mathematical evaluation provides a definite identification of inhomogeneities of the magnetic field in the process of producing the line chart and therefore quick and simple identification of the location of cable splices and cable faults is possible. To optimise the location result, another test series can be recorded for example with different distances of the test points above the cable route.

An additional advantage is given if an evaluation of the degree of inhomogeneity of the magnetic field takes place and the result is readable directly from the identification in the line chart, for example by different line widths, coloration, or patterns on the line of the chart. Further, an audio response indicating the degree of inhomogeneity can also be included.

In some embodiments of the invention, the test series can be overlayable with a Geo-Information-System of the route of the cable or the pipeline.

In summary, some embodiments of the present invention can include a receiver, in allocation to the cable with a coupled audio frequency generator. The receiver records test values obtained from signals of the antenna coils for the horizontal and vertical components of a magnetic field from the cable. The test values can be processed by parallel circuitry coupled to the antenna coils having independent amplifiers, filters and analog-to-digital converters. Test values may be recorded at various test points, which can be separated by approximately the same distance, along cable routes to form test value groups. In some embodiments, test values may be stored in a memory in response to activation of a switch on the receiver. Stored test value groups in the succession of the individual test values of each test point can then be utilized in a processor to determine a degree of inhomogeneity of the magnetic field. The degree of inhomogeneity along the cable route can then be displayed.

In some embodiments, the switch can be formed by a time controlled encoder.

These and other embodiments of the invention are further discussed below with respect to the following figures.

In the figures, elements having the same identification have the same or similar functions.

DETAILED DESCRIPTION

Systems and methods according to embodiments of the present invention concern location in a buried cable of cable splices and cable faults, for example connection splices, branch splices and sheath faults. In some embodiments, an audio frequency generator is coupled to the cable. The cable route can then be traced with an audio frequency tuned receiver according to the present invention. Test values related to the magnitude of orthogonal components of the magnetic field, for example the horizontal and vertical components, at various test points along the cable route can be recorded. A degree of inhomogeneity can be determined in the magnetic field and displayed in a line graph. Cable splices and faults are clearly identified by the degree of inhomogeneity in the magnetic field strength. In some embodiments of the invention, the test values can be read out of the receiver through an interface to allow for further processing of the data.

Figure 1:
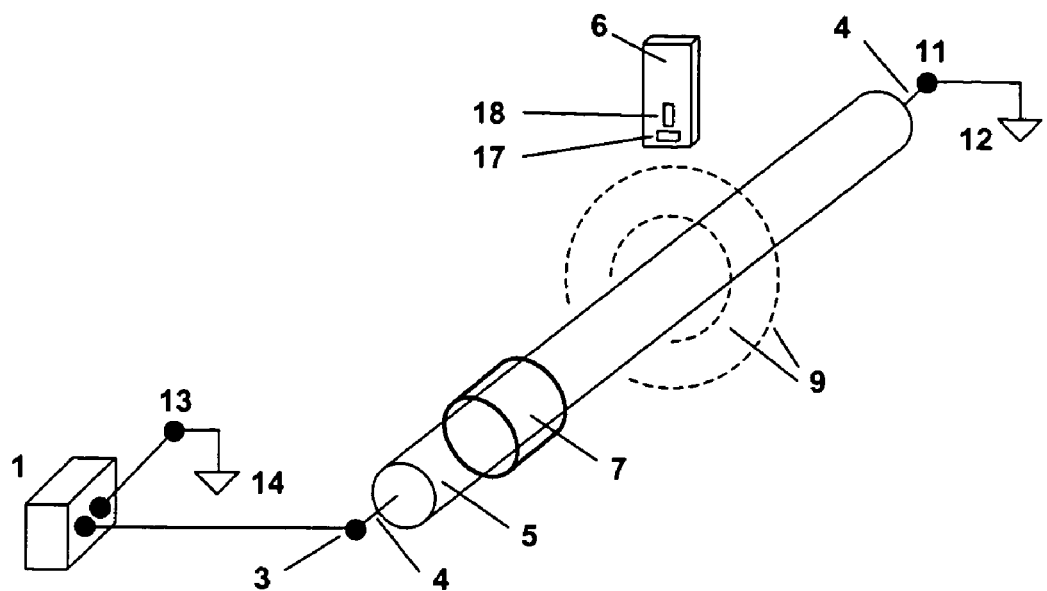
FIG. 1 shows a block diagram illustrating a system for locating cable faults and splices according to the present invention.

FIG. 1 shows a system for locating cable faults and cable splices according to the present invention. An audio frequency generator 1 with a first pole 3 is coupled to an inside conductor 4 at an end of a cable 5. A second pole 13 of audio frequency generator 1 is then coupled to an earth point 14. Conductor 4 of cable 5 can be coupled to earth point 12 on the end of cable 5 opposite the end coupled to first pole 3 of audio frequency generator 1.

The electric circuit for the audio frequency signal of audio frequency generator 1 is thus formed with earth contacts 14 and 12 closing the circuit. A receiver 6 includes at least two antenna coils: a first antenna coil 17 oriented with a horizontal directional characteristic; and a second antenna coil 18 oriented with vertical directional characteristic. In some embodiments, first antenna coil 17 and second antenna coil 18 are oriented such that orthogonal components of the magnetic field can be determined. In the embodiment shown in FIG. 1, first antenna coil 17 and second antenna coil 18 are orthogonally arranged. Receiver 6 detects and records a magnetic field 9 generated by the current signal in conductor 4 generated by audio frequency generator 1. First antenna coil 17 and second antenna coil 18 provide signals related to the strength of magnetic field 9 and to the orientation of first antennal coil 17 and second antenna coil 18, respectively, with respect to magnetic field 9. Receiver 6, therefore, can be oriented with respect to cable 5 such that first antenna coil 17 detects a maximum magnetic field and creates a maximum signal and second antenna coil 18 detects a minimum magnetic field and generates a minimum signal.

Figure 2:
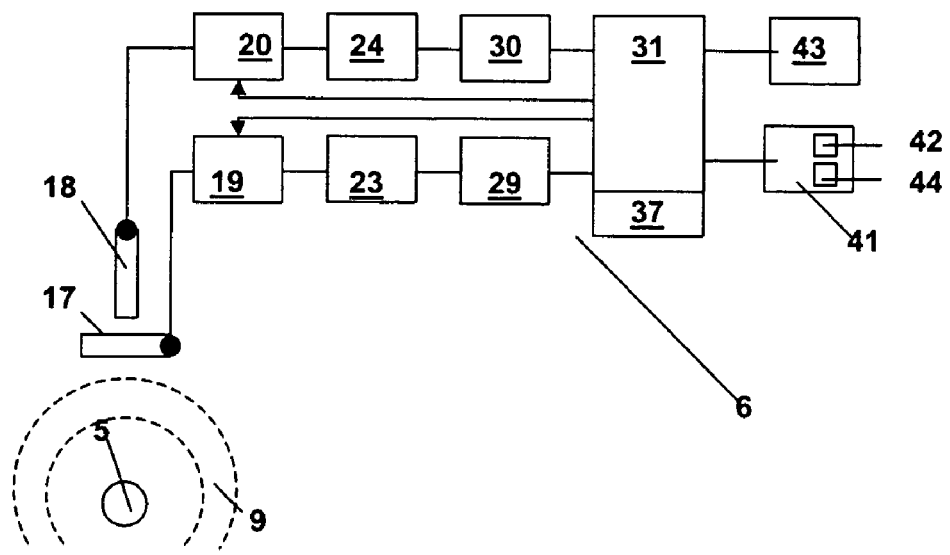
FIG. 2 shows a block diagram of a receiver according to the present invention.

FIG. 2 shows a block diagram of receiver 6 according to some embodiments of the present invention. Magnetic field 9 generated by the current flowing in cable 5 is received by antenna coil 17. The signal from antenna coil 17, which is dependent on the field strength of magnetic field 9, is supplied to an amplifier 19. The parameters of amplifier 19 can be determined by processor 31. In some embodiments, the gain of amplifier 19 is set logarithmically with the magnitude of the signal from antenna coil 17 by processor 31. The output signal from amplifier 19 is input to a filter 23, which is tuned to the signal frequency of audio frequency generator 1. The output signal from filter 23 is input to analog-to-digital converter (ADC) 29.

A second, preferably identically dimensioned circuit path is formed by an antenna coil 18, an amplifier 20, a filter 24, and an ADC 30. Amplifiers 19 and 20 can be adjusted by processor 31 independently from each other. The optimal amplification for each of amplifiers 19 and 20 is respectively adapted to the magnitude of the signals generated by antenna coils 17 and 18, respectively, by an algorithm executed by processor 31. In some embodiments, the optimal amplification for each of amplifiers 19 and 20 is such that the dynamic range of ADC 29 and ADC 30 are utilized without nulls or overflows. Ideally, input signals to ADC 29 and ADC 30 fall close to the median of the dynamic range of the ADC.

The digital values generated by ADC converters 29 and 30 are input to processor 31, along with an indication of position. The digital values representing the magnetic field signal strength as measured by antenna coils 17 and 18 can be displayed on device 43 by processor 31. Device 43 can display the data to a user acoustically, optically or graphically.

Processor 31 is also coupled to user-controlled softkey panel 41, which includes softkey 42 and softkey 44. Activating softkey 42 of softkey panel 41 on receiver 6 induces processor 31 to initiate pooling of the most recently calculated test values to a test value group and the deposition of this test value group into an integrated memory 37, which is coupled to processor 31.

Each test value group receives a test value number for definite identification. For example, the test value number can be a consecutive number or a time-stamp of an integrated timer. With this test value number, a test series is made up of several consecutively recorded test value groups, where the operator of the receiver 6 traces the run of cable 5 and activates softkey 42 at several test points MP-1 to MP-7. In some embodiments, test points MP-1 through MP-7 are separated by approximately the same distances. Data for each test value group is saved when the user activates softkey 42. A test value group typically contains at least two test values, the magnitude of the maximum signal and the magnitude of the minimum signal. Each test value group is related to a single test point (MP-1 through MP-7, for example). Other test values can be added to a test value group, for example the laying depth, current, geographical coordinates or other value.

The activation of softkey 44 on softkey panel 41 of receiver 6 induces processor 31 to initiate the pooling of the saved test value groups in the order of their test value numbers to a test series and the calculation of the data to display in a line chart on a graphic display of display 43, integrated into receiver 6. In some embodiments, calculation of field inhomogeneity may require several test value groups, for example more than seven test value groups.

Figure 3:
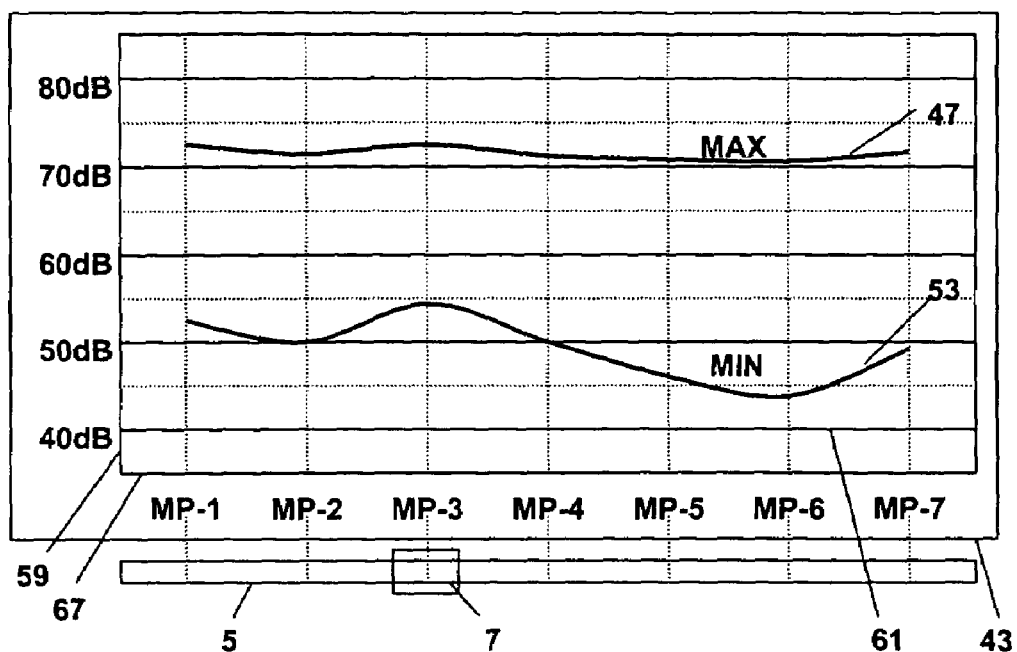
FIG. 3 shows a line chart of recorded test points with the display of the test values of a test series without evaluation of the degree of inhomogeneity of the magnetic field.

FIG. 3 shows an example of device display 43 with a line chart 61. In the diagram according to FIG. 3, cable 5 is displayed with a cable splice 7 and line chart 61 assigned to the test points MP-1 to MP-7, with the display of the test values indicated by curves 47 and 53 of a test series without evaluation of the degree of inhomogeneity in magnetic field 9.

The division and labeling of the axes of line chart 61 shown in FIG. 3 is done conveniently with the indication of the test points MP-1 to MP-7 on the x-axis 67 and the indication of the signal strength on the y-axis 59.

Data points (or test values) obtained from the signals received from antenna coil 17 form the curve of the maximum signal MAX along the cable run and are displayed as GRAF 47 in line chart 61. Data points (or test values) obtained from the signals received from antenna coil 18 form the curve of the minimum signal MIN along the cable run and are displayed in FIG. 3 as GRAF 53.

Figure 4:
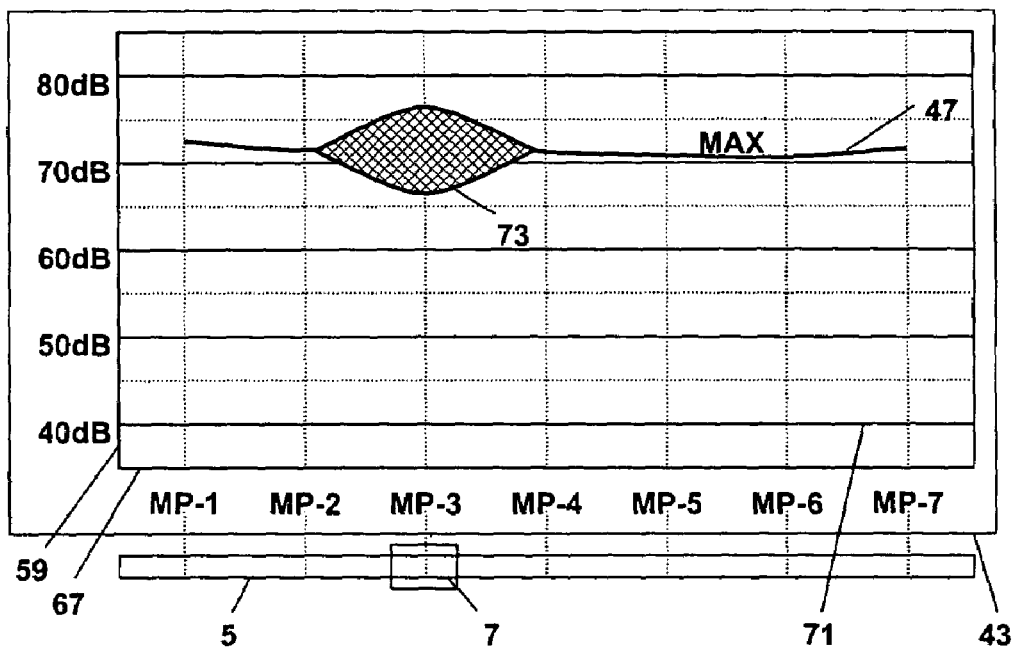
FIG. 4 shows a line chart with the calculated display of the test values of a test series with the identification of the degree of inhomogeneity of the magnetic field.

To convert this data the test values are evaluated in processor 31 where the relation of the test values of a test point to each other and the relation of the test values of the entire test series is aligned. In some embodiments, the field inhomogeneity as shown in FIG. 4 can be calculated as follows. First, the difference between the MAX values, displayed as GRAF 47 in line chart 61, and the MIN values, displayed as GRAF 53 in line chart 61, for each test value group is calculated. Second, the average of all the differences calculated in the first step is calculated. Third, for each test value group, if the difference calculated from the first step is less than the average, a degree of inhomogeneity is calculated.

In one example, the degree of inhomogeneity may have values of between 0 and 3. If the difference at a test group (i.e., at a test point) is greater than or equal to the average difference, then the degree of inhomogeneity is set to 0. If the difference at a test group is less than the average but greater than $7/10$ the average, then the degree of inhomogeneity can be set to 1. If the difference at a test group is less than the average but greater than $5/10$ the average, then the degree of inhomogeneity can be set to 2. If the difference at a test group is less than the average but greater than $3/10$ the average, then the degree of inhomogeneity can be set to 3. The values $3/10$, $5/10$, and $7/10$ are for example only and other ranges may be utilized in this example.

The result of this analysis is a quantification of the degree of the inhomogeneity of the magnetic field, based on each test point. This measured value is an internally standardised size and indicates directly a multiplier for the line strength in the diagram.

FIG. 4 shows cable 5 with the cable splice 7 as is indicated in FIG. 3. Line chart 71 assigned to the test points with the display of the test values of the test series 47 of the maximum signal MAX with the identification 73 shows the degree of inhomogeneity of magnetic field 9 matched to the MAX values indicated by Graf 47. Normalizing for field inhomogeneity allows the position of cable splice 7 in the route of cable 5 to become distinctly noticeable.

Figure 5:
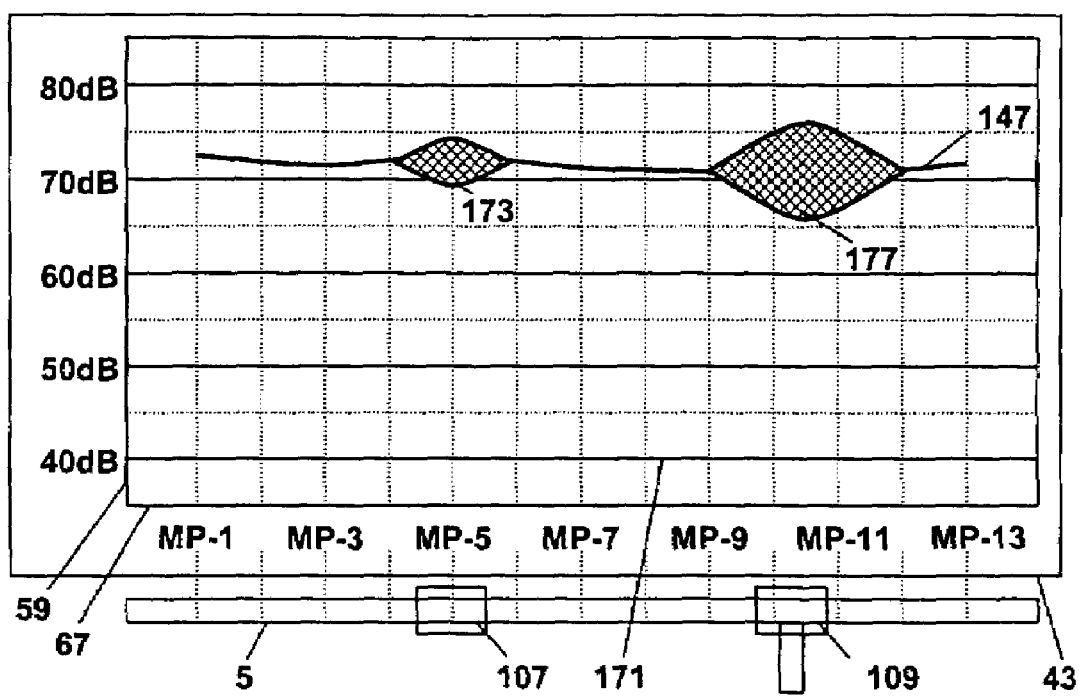
FIG. 5 shows a line chart with the calculated display of the test values of a test series with the identification of the degree of inhomogeneity of the magnetic field for a conductor with a branch tree and a sleeve.

FIG. 5 shows an example of locating cable splices and cable faults on cable 5 where cable 5 includes a connection splice 107 at MP-5 and a tee joint 109 at around MP-10. Line chart 147, assigned to the test points MP-1 to MP-13, with the display of a test series 147 with the identification of the different grades of inhomogeneity 173 and 177 shown via the connection splice 107 and via the tee joint. It is evident that the tee joint 109 effects a higher degree of inhomogeneity of the magnetic field (field distortion) than the connection splice 107.

Further advantageous are possible when receiver 6 includes further methods to measure the laying depth and the amperage. These test values are then distributed to the test value group at the test point and afterwards as a test series in the line chart charged with the measured value for the line strength.

The embodiments discussed above are examples of the invention only and are not intended to limit the scope of the invention. As such, the invention is limited only by the following claims.

I claim:

1. A method of locating cable splices and cable faults, comprising:

coupling an audio frequency generator to a cable to provide a magnetic field at an audio frequency;

receiving at least two orthogonal components of the magnetic field at a receiver;

generating test values corresponding to the orthogonal components of the magnetic field along the cable route, wherein generating test values includes:

amplifying signals from a first antenna coil and a second antenna coil to produce amplified signals;

filtering the amplified signals to produce filtered signals; and digitizing the filtered signals to produce test values;

entering the test values at a plurality of test points on the cable route to a test value memory;

determining a degree of inhomogeneity along the cable route from the test values in the test value memory; and displaying the degree of inhomogeneity.

2. The method of claim 1, wherein coupling the audio frequency generator to the cable includes:

connecting a first pole of the audio frequency generator to a first end of a central conductor of the cable, wherein the first pole is coupled to receive a signal output from the audio frequency generator;

connecting a second pole of the audio frequency generator to an earth ground; and connecting a second end of the central conductor to the earth ground.

3. The method of claim 1, wherein receiving at least two orthogonal components of the magnetic field at the receiver includes:

detecting a first component of the magnetic field with the first antenna coil; and detecting a second component of the magnetic field with the second antenna coil oriented orthogonally to the first antenna coil.

4. The method of claim 1, wherein entering the test values at a plurality of test points on the cable route to a test value memory includes entering an input to a softkey at various points on the cable route to signify a test point;

storing the test values in a memory when the softkey is activated.

5. The method of claim 1, wherein determining a degree of inhomogeneity along the cable route from the test values in the test value memory includes:

retrieving test values corresponding to various test points along the cable route that are stored in memory;

determining the variation in the two orthogonal components of the magnetic field from the test values; and scaling the variation to form the degree of inhomogeneity.

6. The method of claim 1, wherein displaying the degree of inhomogeneity includes:

indicating on a line trace the degree of inhomogeneity.

7. The method of claim 6, wherein indicating on a line trace includes utilizing differing coloration to indicate the degree of inhomogeneity.

8. The method of claim 6, wherein indicating on a line trace includes utilizing different line thicknesses to indicate the degree of inhomogeneity.

9. The method of claim 6, wherein indicating on a line trace includes utilizing different line patterns to indicate the degree of inhomogeneity.

10. The method of claim 6, wherein the line trace is indicated on a display of the receiver.

11. The method of claim 1, further including overlaying a geo-information system cable route over a display to compare with the cable route.

12. A method of locating cable splices and cable faults, comprising:

coupling an audio frequency generator to a cable to provide a magnetic field at an audio frequency;
receiving at least two orthogonal components of the magnetic field at a receiver;
detecting a first component of the magnetic field with a first antenna coil;
detecting a second component of the magnetic field with a second antenna coil oriented orthogonally to the first antenna coil;
generating test values corresponding to the orthogonal components of the magnetic field along the cable route, wherein generating test values includes:
  amplifying signals from the first antenna coil and the second antenna coil to produce amplified signals;
  filtering the amplified signals to produce filtered signals; and
  digitizing the filtered signals to produce the test values; and
entering the test values at a plurality of test points on the cable route to a test value memory;
determining a degree of inhomogeneity along the cable route from the test values in the test value memory; and
displaying the degree of inhomogeneity.

13. The method of claim 12, wherein amplifying signals includes
determining a first gain for amplifying signals from the first antenna coil; and
determining a second gain for amplifying signals from the second antenna coil.

14. The method of claim 12, wherein filtering the amplified signals includes
filtering the amplified signals with band pass filters that pass signals at an audio frequency matched with an output signal of a frequency generator, the frequency generator being coupled to a cable to produce the magnetic field.

15. An apparatus for finding cable splices and cable faults, comprising:
means for coupling an audio frequency generator to a cable to provide a magnetic field at an audio frequency;
means for detecting two orthogonal components of the magnetic field from the cable;
means for obtaining test values coresponding to the orthogonal components of the magnetic field at test points along the cable, wherein wherein obtaining test values includes:
  amplifying signals from a first antenna coil and a second antenna coil to produce amplified signals;
  filtering the amplified signals to produce filtered signals; and
  digitizing the filtered signals to produce test values;
means for determining a degree of inhomogeneity in the magnetic field along the cable from the test values; and
means for displaying the degree of inhomogeneity in the magnetic field.

* * * * *